United States Patent
Ishikawa

(10) Patent No.: US 11,439,051 B2
(45) Date of Patent: Sep. 6, 2022

(54) GROUNDING DETECTION DEVICE AND ELECTRONIC COMPONENT MOUNTER

(71) Applicant: FUJI CORPORATION, Chiryu (JP)

(72) Inventor: Kenzo Ishikawa, Kariya (JP)

(73) Assignee: FUJI CORPORATION, Chiryu (JP)

( * ) Notice: Subject to any disclaimer, the term of this patent is extended or adjusted under 35 U.S.C. 154(b) by 60 days.

(21) Appl. No.: 16/772,926

(22) PCT Filed: Jan. 10, 2018

(86) PCT No.: PCT/JP2018/000351
§ 371 (c)(1),
(2) Date: Jun. 15, 2020

(87) PCT Pub. No.: WO2019/138474
PCT Pub. Date: Jul. 18, 2019

(65) Prior Publication Data
US 2020/0329597 A1    Oct. 15, 2020

(51) Int. Cl.
*B23P 19/00* (2006.01)
*H05K 13/08* (2006.01)
*H05K 13/04* (2006.01)

(52) U.S. Cl.
CPC ....... *H05K 13/081* (2018.08); *H05K 13/0409* (2018.08)

(58) Field of Classification Search
CPC ............. H05K 13/0409; H05K 13/081; H05K 13/0815
See application file for complete search history.

(56) References Cited

U.S. PATENT DOCUMENTS

| 4,496,229 A * | 1/1985 | Ogasawara | G03B 3/10 |
| | | | 396/133 |
| 10,725,477 B2 * | 7/2020 | Nan | A47L 9/00 |
| 2009/0225304 A1 | 9/2009 | Hiyoshi et al. | |

FOREIGN PATENT DOCUMENTS

| CN | 1893811 A | 1/2007 |
| JP | 2000-353725 A | 12/2000 |
| JP | 2006-196618 A | 7/2006 |
| JP | 2007-19296 A | 1/2007 |
| JP | 2015-76529 A | 4/2015 |

OTHER PUBLICATIONS

Extended European Search Report dated Nov. 20, 2020 in European Patent Application No. 18899204.4, 10 pages.
International Search Report dated Mar. 20, 2018 in PCT/JP2018/000351 filed on Jan. 10, 2018, 1 page.

* cited by examiner

*Primary Examiner* — Paul D Kim
(74) *Attorney, Agent, or Firm* — Oblon, McClelland, Maier & Neustadt, L.L.P.

(57) ABSTRACT

A grounding includes a photoelectric sensor that emits light to a detection region in which the detection target portion moves in conjunction with the grounding of the electronic component to a board and receives light from the detection region, and a grounding discrimination section that discriminates between the presence or absence of the grounding based on a signal from the photoelectric sensor. The detection target portion is disposed in the detection region in the ungrounded state.

6 Claims, 5 Drawing Sheets

GROUNDING DETECTION DEVICE AND ELECTRONIC COMPONENT MOUNTER

TECHNICAL FIELD

The present disclosure relates to a grounding detection device for detecting grounding of an electronic component to a board and an electronic component mounter comprising the grounding detection device.

BACKGROUND ART

Patent Literature 1 discloses an electronic component mounter configured to detect the grounding of an electronic component to a board (hereinafter, as appropriate, abbreviated as grounding) using an optical fiber sensor. When an electronic component picked up by a suction nozzle is grounded to a board, the amount of light receiving section by a light receiver of the optical fiber sensor is reduced. Then, upon a timing of the amount of light received being less than or equal to a predetermined threshold value, the optical fiber sensor transmits a grounding detection signal to a control device.

PATENT LITERATURE

Patent Literature 1: JP-A-2015-76529

BRIEF SUMMARY

Technical Problem

The sensor of a conventional electronic component mounter may falsely detect the grounding from the sensor output, which may be caused by the chattering noises and the like, even though an electronic component is not actually grounded to the board. In order to avoid false detection, a dead region next to the detection region of the sensor is secured in an ungrounded state (i.e., a state in which an electronic component is not grounded to the board). However, after setting the dead region, until the suction nozzle passes through the dead region and enters the detection region, the electronic component mounter cannot detect the grounding, even if the electronic component is actually grounded to the board. Therefore, grounding cannot be detected promptly. The present disclosure thus aims for providing a grounding detection device and an electronic component mounter capable of quickly detecting grounding.

Solution to Problem

In order to solve the above problem, the grounding detection device of the present disclosure includes: a photoelectric sensor configured to emit light to a detection region in which a detection target portion moves in conjunction with grounding of an electronic component to a board, and receives the light from the detection region; and a grounding discrimination section configured to discriminate between the presence or absence of the grounding based on a signal from the photoelectric sensor; wherein the detection target portion is disposed in the detection region in an ungrounded state, the ungrounded state being a state in which the electronic component is not grounded to the board.

Here, meaning of "the detection target portion is disposed in the detection region in an ungrounded state" includes a case in which the detection target portion is completely in the detection region in the ungrounded state, a case in which a part of the detection target portion is in the detection region in the ungrounded state, and a case in which the detection target portion and the detection region are connected in the ungrounded state.

In order to solve the above-mentioned problem, an electronic component mounter of the present disclosure includes the grounding detection device and a suction nozzle for mounting the electronic component on the board, and the detection target portion is associated with the movement of the suction nozzle.

Advantageous Effects

With the grounding detecting device and the electronic component mounter of the present disclosure, in the ungrounded state, the detection target portion has been already disposed in the detection region. Therefore, in the ungrounded state, at least a part of the light has been already shielded by the detection target portion. Thus, there is no need for securing a dead region adjacent to the detection region. As a result, the grounding is promptly detected.

DESCRIPTION OF EMBODIMENTS

Figure 1:
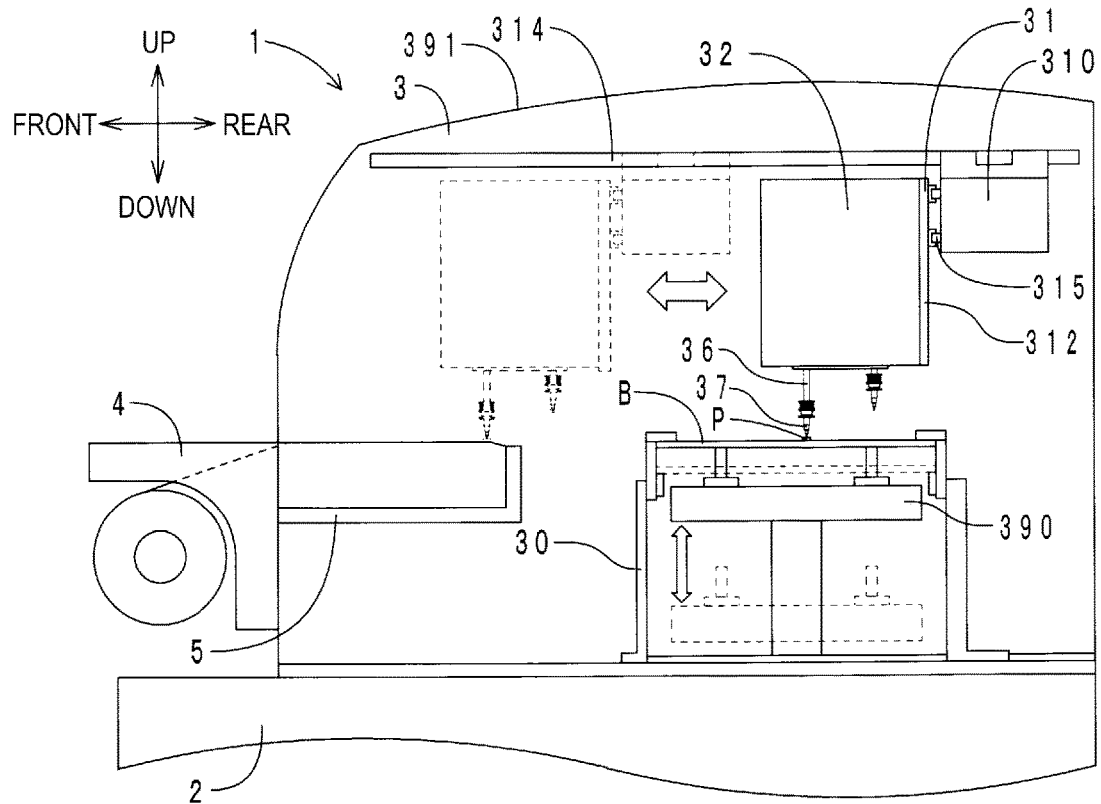
FIG. 1 is a right side view of an electronic component mounter of an embodiment of the electronic component mounter of the present disclosure.
Figure 2:
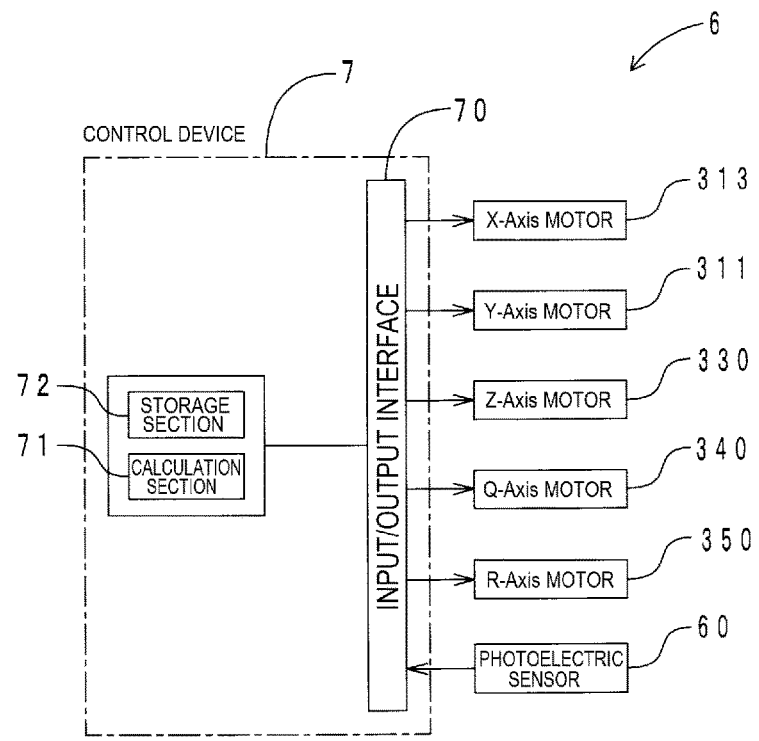
FIG. 2 is a block diagram of the electronic component mounter.
Figure 3:
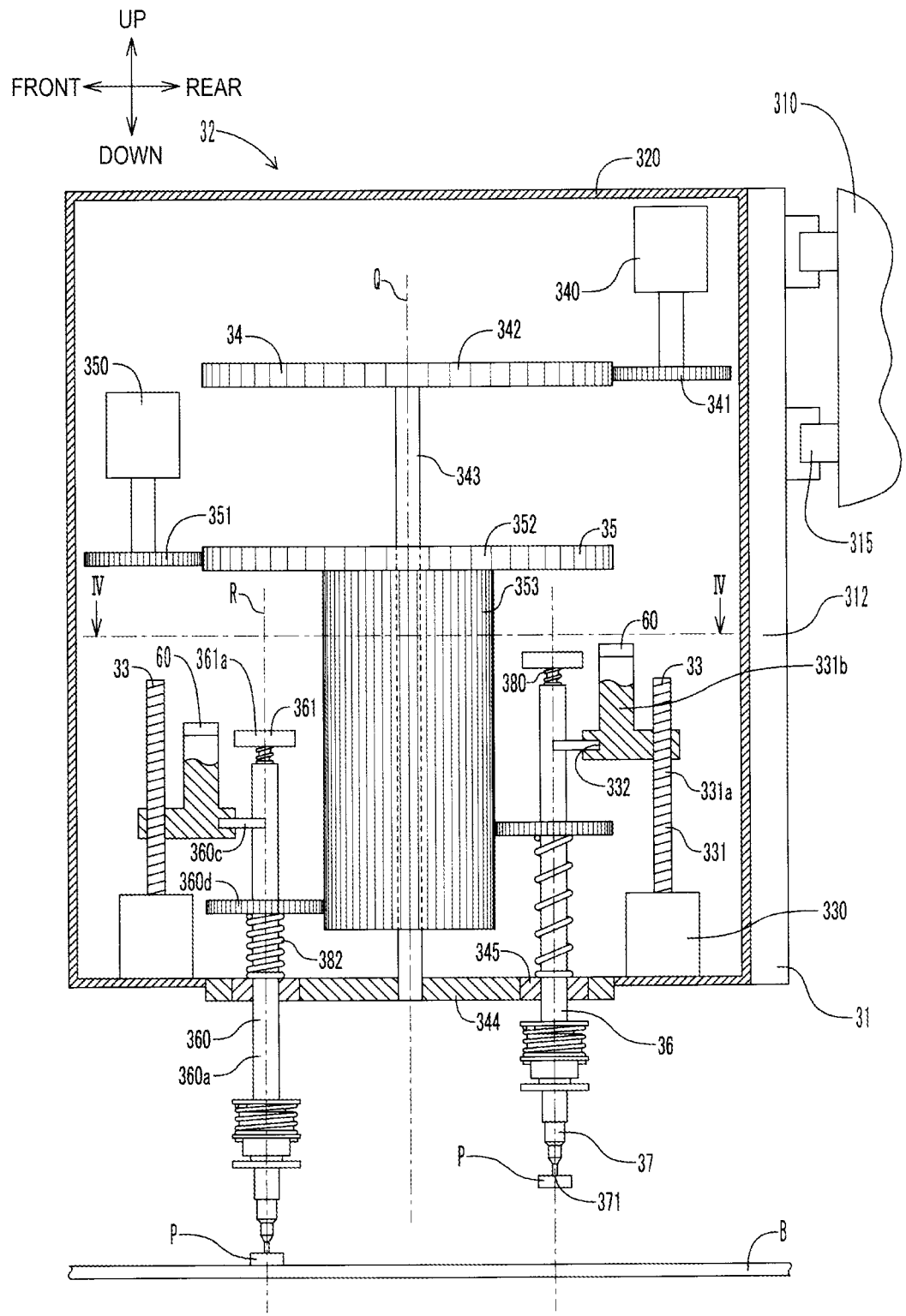
FIG. 3 is a cross-sectional view of a mounting head of the electronic component mounter.
Figure 4:
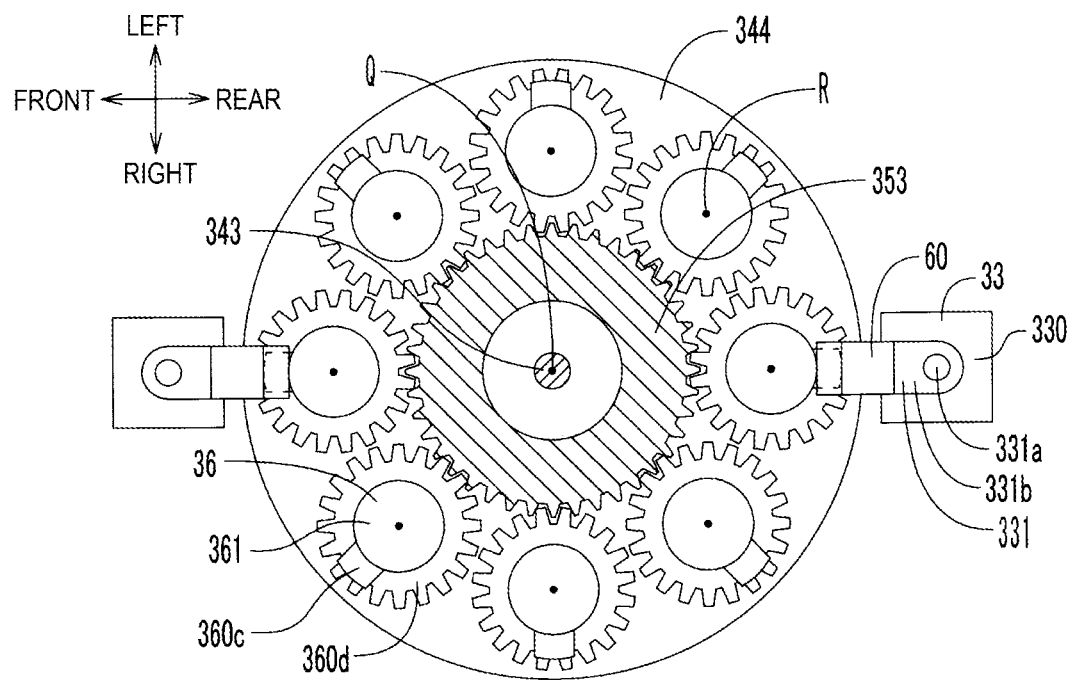
FIG. 4 is a cross-sectional view along IV-IV of FIG. 3.
Figure 5:
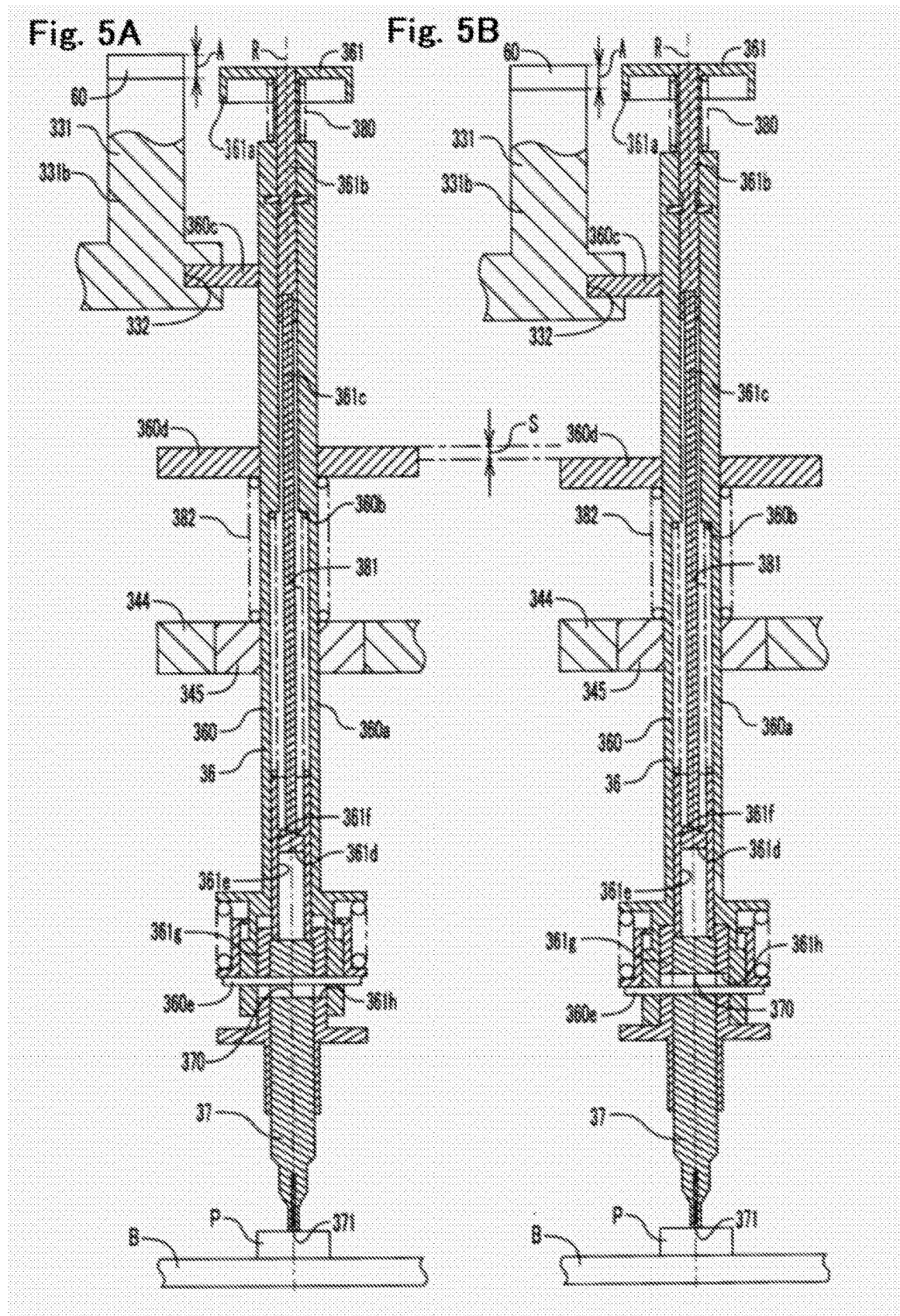
FIG. 5 is a cross-sectional view of a holder and a suction nozzle of the electronic component mounter.

Hereinafter, a grounding detection device and an electronic component mounter of an embodiment of the present disclosure will be described. FIG. 1 shows a right side view of an electronic component mounter of this embodiment. FIG. 2 shows a block diagram of the electronic component mounter of the embodiment. FIG. 3 shows a cross-sectional view of a mounting head of the electronic component mounter. FIG. 4 shows a cross-sectional view along IV-IV of FIG. 3. FIG. 5 shows a cross-sectional view of a holder and a suction nozzle of the electronic component mounter. More specifically, FIG. 5A shows a cross-sectional view of a holder and a suction nozzle in a grounded state (Part 1). FIG. 5B shows a cross-sectional view of the holder and the suction nozzle in the grounded state (Part 2).

A "grounded state" is a state in which an electronic component is grounded to a board. In FIG. 1 shows a view through housing 391 of module 3. Among "holder 36 and suction nozzle 37" of the front side (grounded state) and "holder 36 and suction nozzle 37" of the rear side (ungrounded state) of FIG. 3, holders 36 and suction nozzles 37 of FIG. 5A and FIG. 5B are corresponding to "holder 36 and suction nozzle 37" of the front side of FIG. 3.

<Configuration of Electronic Component Mounter>

First, the configuration of the electronic component mounter of the present embodiment will be described. As shown in FIGS. 1 and 2, the electronic component mounter 1 includes base 2, module 3, tape feeder (component supply device) 4, device pallet 5, and grounding detection device 6.

Base 2 is arranged on a floor (not shown) of a factory. Module 3 is installed on base 2. As shown in FIG. 1 and FIGS. 3 to 5B, module 3 includes board conveyance device 30, XY robot 31, mounting head 32, eight holders 36, eight suction nozzles 37, first spring 380, second spring 381, third spring 382, board lifting and lowering device 390, and housing 391.

As shown in FIG. 1, housing 391 constitutes the outer shell of module 3. Board conveyance device 30 conveys board B from the left side (i.e., the upstream side) to the right side (i.e., the downstream side). Board lifting and lowering device 390 can lift board B from the belt conveyor of board conveyance device 30.

As shown in FIGS. 1 to 2, XY robot 31 includes Y-axis (front-rear axis) slider 310, Y-axis motor 311, X-axis (left-right axis) slider 312, X-axis motor 313, a pair of left and right Y-axis guide rails 314, and a pair of upper and lower X-axis guide rails 315. The pair of left and right Y-axis guide rails 314 are disposed on the upper wall lower face of housing 391. Y-axis slider 310 is attached to the pair of left and right Y-axis guide rails 314 so as to be slidable in the front-rear direction. The pair of upper and lower X-axis guide rails 315 are disposed on the front face of Y-axis slider 310. X-axis slider 312 is attached to the pair of upper and lower X-axis guide rails 315 so as to be slidable in the right-left direction.

As shown in FIG. 1, mounting head 32 is attached to X-axis slider 312. Therefore, mounting head 32 can be moved in the front-rear and right-left directions by XY robot 31. As shown in FIG. 3, mounting head 32 includes cover 320, a pair of front and rear lifting and lowering portions 33, revolution portion 34, and rotation portion 35.

As shown in FIG. 3, cover 320 constitutes the outer shell of mounting head 32. The pair of front and rear lifting portions 33 are disposed around the revolution axis (center axis of eight suction nozzles 37) Q at 180° so as to face each other. Each lifting and lowering portion 33 includes Z-axis (vertical axis) motor 330 and ball-screw portion 331. Ball-screw portion 331 includes shaft (fixed portion) 331a and nut (movable portion) 331b. Z-axis motor 330 is attached to cover 320. Shaft 331a is connected to a rotation shaft of Z-axis motor 330. Shaft 331a extends in the up-down direction. Nut 331b is annularly mounted on shaft 331a via multiple balls (not shown). Nut 331b is disposed in recessed portion (power transmission portion) 332.

As shown in FIGS. 3 to 4, revolution portion 34 is provided with Q-axis (revolving shaft) motor 340, revolution first gear 341, revolution second gear 342, revolution shaft 343, rotation plate 344, and eight collars 345. Q-axis motor 340 is attached to cover 320 via a bracket (not shown). Revolution first gear 341 is connected to rotary shaft of Q-axis motor 340. Revolution second gear 342 is engaged with revolution first gear 341. Rotation plate 344 is disposed below revolution second gear 342 with a predetermined distance in between. Revolution shaft 343 connects revolution second gear 342 and rotation plate 344. Eight collars 345 are spaced apart from each other by 45 degrees about revolution axis Q. Each collar 345 has a cylindrical shape with a short axis extending in the up-down direction. Each collar 345 is embedded in rotation plate 344.

As shown in FIGS. 3 to 4, rotation portion 35 is provided with R-axis (rotation axis) motor 350, first gear 351 for rotation, second gear 352 for rotation, and third gear 353 for rotation. R-axis motor 350 is attached to cover 320 via a bracket (not shown). Rotation first gear 351 is connected to the rotation shaft of R-axis motor 350. Second rotation gear 352 engages with first rotation gear 351. Second rotation gear 352 has a circular shape. Third rotation gear 353 is connected to the lower side of rotation second gear 352. Third rotation gear 353 has a cylindrical shape. The aforementioned rotation shaft 343 passes through second rotation gear 352 and third rotation gear 353 in the up-down direction.

As shown in FIG. 3, FIG. 5A, and FIG. 5B, eight holders 36 are inserted through collars 345, respectively. Holder 36 is provided with cladding portion 360 and core portion 361. Cladding portion 360 is movable in the up-down direction with respect to collar 345. Cladding portion 360 includes outer cylindrical member 360a, protruding portion (power transmission portion) 360c, holder gear 360d, and pin (guided portion) 360e. Stepped surface 360b facing downward is disposed radially inward of outer cylindrical member 360a. Protruding portion 360c is disposed on the outer peripheral surface of outer cylindrical member 360a. Protruding portion 360c is engageable with recessed portion 332 in the up-down direction. Holder gear 360d is disposed on the outer peripheral surface of outer cylindrical member 360a. As shown in FIG. 4, holder gear 360d meshes with third rotation gear 353. As shown in FIGS. 5A, 5B, pin 360e is disposed at the lower end of outer cylindrical member 360a. Pin 360e penetrates outer cylindrical member 360a in the diameter direction.

As shown in FIGS. 5A, 5B, in the grounded state, cladding portion 360 is movable in the up-down direction with respect to core portion 361 only in pushing stroke S to be described later. FIG. 5A shows a state in which cladding portion 360 is positioned at the top dead center of pushing stroke S. Also shown in FIG. 5B is a state in which cladding portion 360 is positioned at the bottom dead center of pushing stroke S.

As shown in FIGS. 5A, 5B, core portion 361 includes, from the upper side to the lower side, detection target portion 361a, first axial member 361b, second shaft member 361c, first inner cylindrical member 361e, and second inner cylindrical member 361g. Detection target portion 361a protrudes upward from outer cylindrical member 360a. First shaft member 361b is connected to the lower side of detection target portion 361a. First shaft member 361b is inserted through outer cylindrical member 360a. Second shaft member 361c is connected to the lower portion of first shaft member 361b. Enlarged diameter portion 361d is disposed at the lower end of second shaft member 361c. First inner cylindrical member 361e accommodates the lower portion of second shaft member 361c. Reduced diameter portion 361f is disposed radially inward from first inner cylindrical member 361e. Enlarged diameter portion 361d engages with reduced diameter portion 361f from underneath. Second inner cylindrical member 361g is connected to the lower portion of first inner cylindrical member 361e. Second inner cylindrical member 361g has a pair of elongated holes (guiding portions) 361h. The pair of elongated holes 361h are disposed around rotation axis R of suction nozzle 37 at 180° so as to face each other. Elongated holes 361h extend in the up-down direction.

As shown in FIGS. 5A, 5B, each of eight suction nozzles 37 is accommodated in second inner cylindrical member 361g. Suction nozzle 37 has elongated hole (guiding portion) 370. Elongated hole 370 penetrates suction nozzle 37 in the radial direction. Elongated hole 370 extends in the up-down direction. The pair of elongated holes 361h and elongated hole 370 have the same height. Pin 360e is inserted through the pair of elongated holes 361h and elongated hole 370. Pin 360e is movable in the up-down direction along the pair of elongated holes 361h and elongated hole 370 in accordance with pushing stroke S. Pickup portion 371 is disposed at the lower end of suction nozzle 37. Pickup portion 371 can pick up and release electronic component P by air pressure supplied through a gas passage (not shown).

As shown in FIGS. 5A, 5B, first spring 380 is disposed between detection target portion 361a and outer cylindrical member 360a. First spring 380 biases outer cylindrical member 360a, that is, cladding portion 360, downward with respect to detection target portion 361a, that is, core portion 361. Second spring 381 is disposed between stepped surface 360b and first inner cylindrical member 361e. Second spring 381 urges stepped surface 360b, that is, cladding portion 360, upward with respect to first inner cylindrical member 361e, that is, core portion 361. Third spring 382 is disposed between holder gear 360d and collar 345. Third spring 382 urges holder gear 360d, that is, cladding portion 360 upward with respect to collar 345, that is, rotation plate 344.

As shown in FIGS. 2 to 3, grounding detection device 6 includes a pair of front and rear photoelectric sensors 60 and control device (grounding discrimination section) 7. Photoelectric sensor 60 is a reflective photoelectric sensor. Photoelectric sensor 60 is disposed on nut 331b. Photoelectric sensor 60 is movable in the up-down direction together with nut 331b. Photoelectric sensor 60 includes a light projector (not shown) and a light receiver. The light projector emits light to detection target portion 361a. The light receiver receives light reflected from detection target portion 361a. As shown in FIGS. 5A, 5B, detection region A is set horizontally adjacent to photoelectric sensor 60 (i.e., toward detection target portion 361a).

As shown in FIG. 2, control device 7 includes input/output interface 70, calculation section 71, and storage section 72. Input/output interface 70 is connected to photoelectric sensor 60. Further, input-output interface 70 via a drive circuit (not shown), X-axis motor 313, Y-axis motor 311, Z-axis motor 330, Q-axis motor 340, is connected to R-axis motor 350.

As shown in FIG. 1, device pallet 5 is installed at the front of housing 391. Tape feeder 4 is installed on device pallet 5. Suction nozzle 37 takes out electronic component P from tape feeder 4 and mounts electronic component P at predetermined mounting coordinates of board B.

<Movement of Mounting Head, Holder, and Suction Nozzle>

Next, the movement of the mounting head, the holder, and the suction nozzle of the electronic component mounter of the present embodiment will be described. As shown in FIGS. 1 to 2, when moving mounting head 32 in the horizontal direction, control device 7 drives Y-axis motor 311 and X-axis motor 313. When control device 7 drives Y-axis motor 311, Y-axis slider 310, that is, mounting head 32, moves along Y-axis guide rails 314 in the front-rear direction. When control device 7 drives X-axis motor 313, X-axis slider 312, that is, mounting head 32, moves along X-axis guide rails 315 in the right-left direction.

As shown in FIGS. 2 to 3, when rotating (i.e., revolving) eight holders 36 about revolution axis Q, control device 7 drives Q-axis motor 340. Suction nozzles 37 also moves together with holders 36. When control device 7 drives Q-axis motor 340, revolution first gear 341 rotates, and revolution second gear 342, revolution shaft 343, and rotation plate 344 rotate together. That is, eight collars 345, that is, eight holders 36, rotate about revolution axis Q. Therefore, among eight holders 36, two holders 36 facing each other at 180° degrees can be set at the lifting and lowering position (i.e., a position where protruding portion 360c engages with recessed portion 332 as shown by the pair of holders 36 in the front and rear of FIG. 3).

As shown in FIGS. 2 to 4, when rotating holders 36 about rotation axis R, control device 7 drives R-axis motor 350. Suction nozzles 37 also moves together with holders 36. When control device 7 drives R-axis motor 350, first rotation gear 351 rotates, and second rotation gear 352 and third rotation gear 353 rotate together. Third rotation gear 353 engages with holder gear 360d. Therefore, when third rotation gear 353 rotates, holder gear 360d, that is, holder 36, rotates about rotation axis R.

As shown in FIGS. 2 to 3, when lowering holder 36 at the lifting and lowering position, control device 7 drives Z-axis motor 330. Suction nozzle 37 also moves down together with holder 36. When control device 7 drives Z-axis motor 330, shaft 331a rotates about its own axis. As a result, nut 331b, that is, recessed portion 332 descends with respect to shaft 331a. Accordingly, protruding portion 360c engaged with recessed portion 332, that is, holder 36 at the lifting and lowering position, is lowered against the biasing force of third spring 382. Electronic component P picked up by suction nozzle 37 is grounded to board B.

Pushing stroke S is set to holder 36. As shown in FIG. 5A (i.e., a state in which cladding portion 360 is positioned at the top dead center of pushing stroke S) and FIG. 5B (a state in which cladding portion 360 is positioned at the bottom dead center of pushing stroke S), by consuming at least a portion of pushing stroke S, cladding portion 360 can be lowered with respect to suction nozzle 37 and core portion 361 against the biasing force of third spring 382 and second spring 381 even if electronic component P is grounded to board B. Therefore, it is possible to reduce the impact when electronic component P is grounded to board B.

<Movement of Electronic Component Mounter>

Next, the movement at the time of board production by the electronic component mounter of the present embodiment will be described. As shown in FIG. 1, first, control device 7 drives board conveyance device 30, and a board work machine (e.g., a screen printing machine, a board appearance inspection machine, an electronic component mounter) on the left side (i.e., the upstream side) conveys board B. Next, control device 7 drives board lifting and lowering device 390 to lift board B to a predetermined mounting height. Subsequently, control device 7 sequentially picks up multiple electronic components P from tape feeder 4 using all suction nozzles 37.

Specifically, as shown in FIGS. 1 to 4, first, control device 7 drives Q-axis motor 340 to set desired holder 36 and suction nozzle 37 to the lifting and lowering position. Next, control device 7 drives Z-axis motor 330 to lower holder 36 and suction nozzle 37, and picks up electronic component P from tape feeder 4 with suction nozzle 37. By repeating a number of times equal to the number of arranged suction nozzles 37, this operation sets electronic components P to all suction nozzles 37.

Then, control device 7 drives Y-axis motor 311 and X-axis motor 313, and conveys the multiple electronic components P to board B. Thereafter, control device 7 sequentially mounts the multiple electronic components P to multiple mounting coordinates of board B by the same movement as that at the time of picking up electronic components P.

When mounting of electronic components P is completed, control device 7 drives board lifting and lowering device 390 to lower board B. Thereafter, control device 7 drives board conveyance device 30 to unload board B to the board work machine on the right side (i.e., the downstream side).

<Grounding Detection Method>

Next, a grounding detection method executed by the grounding detection device of the present embodiment. Of the series of movements of electronic component mounter 1 described above, the grounding detection method is executed when suction nozzle 37 mounts electronic components to board B.

Figure 6:
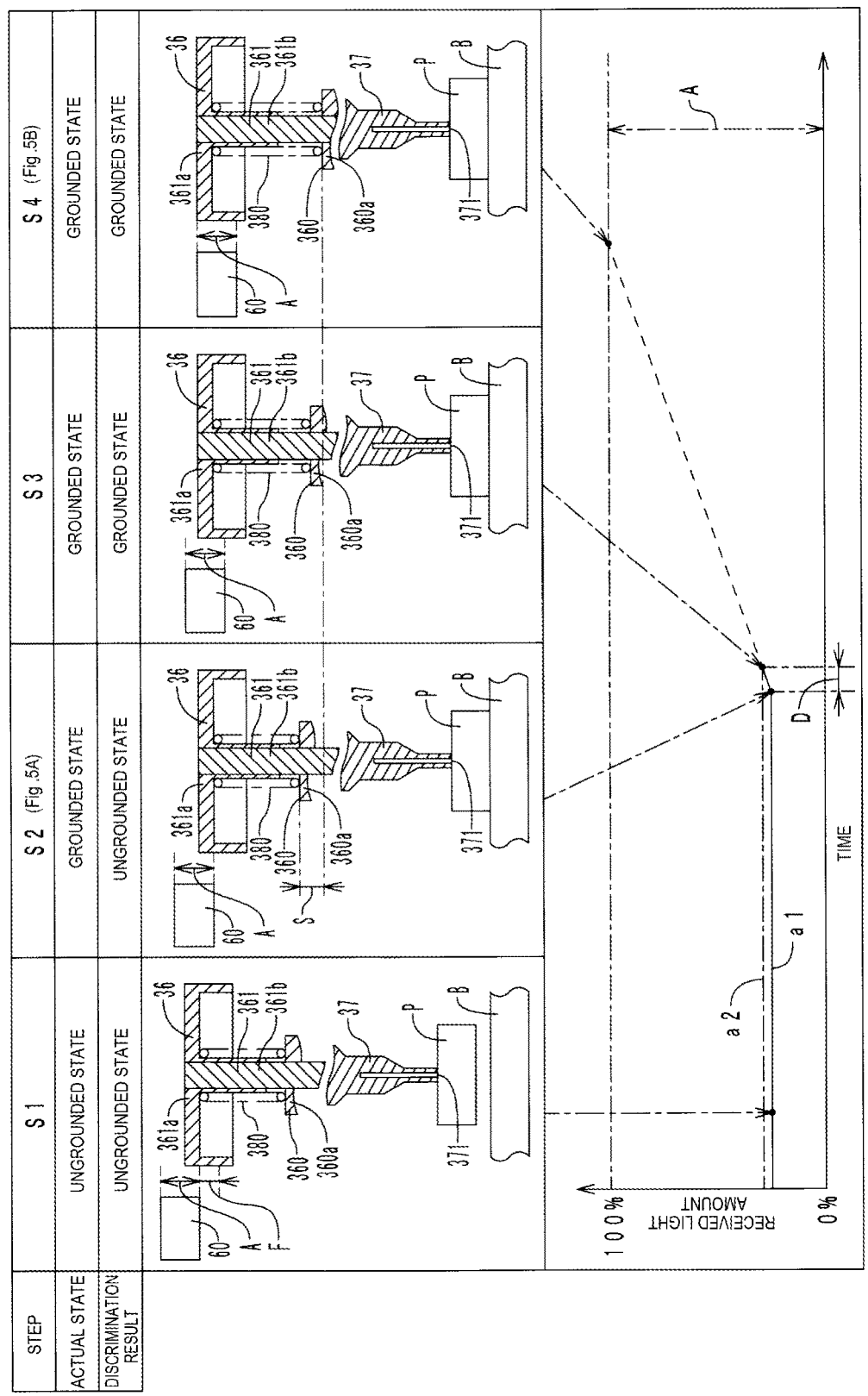
FIG. 6 is a schematic diagram of a grounding detection method performed by the grounding detection device of the electronic component mounter.

FIG. 6 shows a schematic diagram of the grounding detection method performed by the grounding detection device of this embodiment. Incidentally, step S2 corresponds to FIG. 5A (i.e., the state in which cladding portion 360 is positioned at the top dead center of pushing stroke S), and step S4 corresponds to FIG. 5B (i.e., the state in which cladding portion 360 is positioned at the bottom dead center of pushing stroke S). However, in the grounding detection method described below, steps S1 to S3 are executed. Step S4 is not executed.

The grounding detection method includes a reference value setting step and a grounding discrimination step. As shown in step S1, the reference value setting step is performed in an ungrounded state (specifically, the state as shown by holder 36 and suction nozzle 37 on the rear side of FIG. 3 before holder 36 and suction nozzle 37 are lowered, in which the horizontal conveyance of electronic component P by XY robot 31 is completed). As shown in FIG. 2, in the reference value setting step, control device 7 detects the amount of light received from the light receiver of photoelectric sensor 60. The received light amount is included in the concept of "received light level" of the present disclosure.

If detection target portion 361a does not enter detection region A (for example, if dead region F is fixed under detection region A and detection target portion 361a is disposed under dead region F in an ungrounded state as schematically shown in step S1), the light from the light projector does not completely enter the light receiver. This position (hereinafter, referred to as the initial state as appropriate) corresponds to 0%. If detection target portion 361a completely enters detection region A (for example, if detection target portion 361a is disposed over the entire length of detection region A in the up-down direction as shown in step S4), the total amount of the reflected light from detection target portion 361a enters the light receiver. This state (hereinafter, referred to as the end-of-life state) corresponds to 100%.

On the other hand, as shown in step S1, the upper end of detection target portion 361a enters detection region A in the ungrounded state. In the initial value setting step, control device 7 shown in FIG. 2 detects the amount of light received from the light receiver in the ungrounded state and sets reference level a1. For example, when the received light amount of the light receiver in the ungrounded state is 10% with the initial state as 0% and the final state as 100%, control device 7 sets reference level a1 to 10%. Further, with reference level a1 at 100%, control device 7 sets threshold value a2 to, for example, 110%.

The grounding discrimination step is executed when switching from the ungrounded state to the grounded state as shown in steps S1 to S3. That is, it is executed when holder 36 and suction nozzle 37 descend. In the grounding determination step, control device 7 shown in FIG. 2 drives Z-axis motor 330, with respect to mounting head 32 shown in FIG. 3, lowering holder 36 and suction nozzle 37. In addition, control device 7 continuously detects the received light amount from the light receiver of photoelectric sensor 60.

When holder 36 is lowered and electronic component P is grounded to board B, suction nozzle 37 and core portion 361 immediately stops descending (steps S1 to S2). However, cladding portion 360, together with nut 331b and photoelectric sensor 60 shown in FIG. 5A, continues to descend (step S3). Therefore, suction nozzle 37 and core portion 361 rise relative to cladding portion 360. When core portion 361 rises relative to cladding portion 360, detection target portion 361a rises relative to detection region A. Therefore, the amount of light received from photoelectric sensor 60 increases. When the received light amount reaches threshold value a2, control device 7 discriminates the grounding of electronic component P to board B. Control device 7 stops Z-axis motor 330 and stops the lowering of holder 36 and suction nozzle 37. Control device 7 releases grounded electronic component P from suction nozzle 37 and drives Z-axis motor 330 to raise holder 36 and suction nozzle 37.

Then, control device 7 sets the next holder 36 and the next suction nozzle 37 (having already picked up electronic component P) directly above the next mounting coordinate. Thereafter, control device 7 executes the above-described reference value setting step, the grounding discrimination step. Thus, control device 7 repeatedly executes the above-described grounding detection method a number of times equal to the number of electronic components P held by mounting head 32.

<Effect>

Next, the operation and effect of the grounding detection device and the electronic component mounter of the present embodiment will be described. With grounding detection device 6 of the present embodiment, as shown in step S1 of FIG. 6, in the ungrounded state, the upper end of detection target portion 361a has already entered detection region A. Therefore, in the ungrounded state, at least a part of the light from the light projector has already been reflected by detection target portion 361a and has entered the light receiver. Therefore, as compared with the case where dead region F schematically shown in step S1 is fixed under detection region A shown in FIG. 6 and detection target portion 361a is disposed under dead region F in the ungrounded state, the grounding can be detected quickly.

Further, in the case where dead region F is fixed under detection region A, even if electronic component P is actually grounded to board B, grounding detection device 6 cannot detect the grounding until detection target portion 361a rises past dead region F and enters detection region A. Therefore, while detection portion 361a passes through dead region F, a pushing force is applied from nut 331b to electronic component P on board B via holder 36 and suction nozzle 37. In this regard, with the grounding detection device of the present embodiment, it is not necessary to set dead region F. Therefore, it is possible to suppress an excessive pushing force from being applied to electronic component P.

Further, with grounding detection device 6 of the present embodiment, as shown in FIG. 6, there is only a minute time lag D between the timing at which the ungrounded state switches to the grounded state (step S2) and the timing at which control device 7 determines that the ungrounded state has switched to the grounded state (step S3). Therefore, the grounding can be detected quickly. Further, control device 7 can determine the grounding state in step S3. Therefore, as shown by the dotted line in FIG. 6, from step S3 to step S4 (until pushing stroke S is completely consumed), there is no possibility for electronic component P to be pushed. Therefore, it is possible to suppress an excessive pushing force from being applied to electronic component P.

Further, in the case of the conventional grounding detection device, grounding has been determined digitally (intermittently, binarily, on/off) by setting the output of photoelectric sensor 60 in the ungrounded state as, for example, "0", and the output of photoelectric sensor 60 in the grounded state as, for example, "1". In contrast, with grounding detection device 6 of the present embodiment, as shown in FIG. 6, control device 7 determines whether there is grounding based on a change in the received light amount with respect to reference level a1. That is, the output of photoelectric sensor 60 detects the grounding in an analog manner (i.e., continuously, with slopes, etc.). Therefore, it is possible to prevent the false detection of the grounding.

Further, with grounding detection device 6 of the present embodiment, control device 7 updates reference level a1 with each grounding. Therefore, even when the height of detection target portion 361a in the ungrounded state shown in step S1 of FIG. 6 is different among multiple suction nozzles 37 arranged in the single mounting head 32, in other words, even when the extent of entry of detection target portions 361a into detection region A is different, detection errors are unlikely to occur.

Further, the received light amount from the light receiver varies due to environmental factors such as temperature drift and the state of the amplifier (not shown). For this reason, if reference level a1 is fixed, the detection accuracy is lowered. In this regard, with grounding detection device 6 of the present embodiment, control device 7 updates reference level a1 with each grounding. Therefore, it is possible to suppress the deterioration of the detection accuracy due to environmental factors.

Further, with grounding detection device 6 of the present embodiment, control device 7 updates threshold a2 in accordance with the update of reference level a1. That is, threshold a2 is not an "absolute" threshold but a "relative" threshold based on reference level a1. In this respect, it is also possible to suppress the occurrence of the above-described detection error and the deterioration of the detection accuracy.

<Other>

An embodiment of the grounding detection device and the electronic component mounting device of the present disclosure has been described above. However, embodiments are not particularly limited to the above embodiment. It is also possible to implement the present disclosure in various modifications and improvements which can be made by those skilled in the art.

Control device 7 of electronic component mounter 1 need not serve as a grounding discrimination section of grounding detection device 6. That is, control device 7 and grounding discrimination section may be independent of each other. The value of reference level a1 with respect to the initial state is not particularly limited. It is sufficient to set the received light amount in the ungrounded state shown in FIG. 4A as reference level a1. In the ungrounded state shown in FIG. 4A, the upper end of detection target portion 361a may coincide with the lower end of detection region A. In this case, with the initial state at 0%, reference level a1 also becomes 0%.

The timing at which reference level a1 is updated is not particularly limited. For example, reference level a1 may be updated with each electronic component conveyance operation of XY robot 31 shown in FIG. 1 (i.e., an operation in which XY robot 31 conveys electronic component P in the horizontal direction from tape feeder 4 to board B), each ending of production of one board B, each power input of electronic component mounter 1, each exchange of suction nozzle 37, each changeover to change the type of board B to be produced, and the like. Further, reference level a1 may be fixed.

The value of threshold a2 with respect to reference level a1 is not particularly limited. When threshold value a2 is brought close to reference level a1 (e.g., 110% or less with reference level a1 set to 100%), it is possible to quickly detect the grounding. When threshold value a2 is moved away from reference level a1 (e.g., 150% or higher with reference level a1 set to 100%), it is possible to suppress false detection of the grounding. Further, threshold value a2 may be fixed.

The positions of detection target portion 361a and photoelectric sensor 60 are not particularly limited. Parts which do not move when pushing stroke S is consumed in the grounded state (e.g., core portion 361, shaft 331a, suction nozzle 37, board conveyance device 30, cover 320, rotation plate 344) are referred to as "fixed-side members". Further, in the grounded state, parts which move when pushing stroke S is consumed (e.g., cladding portion 360, nut 331b) are referred to as "moving-side members". In this case, detection target portion 361a may be disposed on either the fixed side or the movable side, and photoelectric sensor 60 may be disposed on the other. For example, detection target portion 361a may be disposed on the fixed side, and photoelectric sensor 60 may be disposed on the movable side. Conversely, detection target portion 361a may be disposed on the movable side, and photoelectric sensor 60 may be disposed on the fixed side. That is, photoelectric sensor 60 need only detect a change in the relative positions of the fixed member and the movable member when pushing stroke S is consumed. The type of photoelectric sensor 60 is not particularly limited. For example, photoelectric sensor 60 of a transmission type or a reflection type (regression reflection type, diffuse reflection type) may be used. Further, a non-contact type sensor other than the photoelectric sensor may be used.

When a transmission type photoelectric sensor 60 is used, the light projector and the light receiver of photoelectric sensor 60 may be disposed on both sides in the horizontal direction with detection target portion 361a interposed therebetween. In this case, the light projector and the light receiver may be attached to nut 331b through the bracket. Hereinafter, a method of setting reference level a1 and threshold a2 in reference value setting step of the grounding detection method when the transmission type photoelectric sensor 60 is used will be described with reference to FIG. 6. In reference value setting step (step S1), control device 7 detects the received light amount from the light receiver of photoelectric sensor 60. The received light amount is included in the concept of "received light level" of the present disclosure. That is, if detection target portion 361a does not enter detection region A, the light from the light projector completely enters the light receiver. This state (hereinafter, as appropriate, referred to as the initial state) corresponds to 100%. On the other hand, as shown in step S1, the upper end of detection target portion 361a enters detection region A in the ungrounded state. In the initial value setting step, control device 7 detects the received light amount from the light receiver in the ungrounded state and sets reference level a1. For example, when the received light amount from the light receiver in the ungrounded state is 90% with the initial state at 100%, control device 7 sets reference level a1 to 90%. Further, control device 7 sets threshold value a2 to, for example, 90% with reference level a1 at 100%.

The number of suction nozzles 37 disposed on a single mounting head 32 is not particularly limited. The number of suction nozzles 37 may be one or a multiple. Mounting head 32 need not include at least one of revolution portion 34 and rotation portion 35. Mounting head 32 may include a single lifting and lowering portion 33. Protruding portion 360c may have a flange shape. The arrangement of recessed portion 332 and protruding portion 360c may be reversed. That is, recessed portion 332 may be disposed in cladding portion 360c and protruding portion 360c may be disposed in nut 331b. Being able to transmit power from nut 331b to cladding portion 360 is all that is necessary. Nut portion (movable portion) 331 may be moved in the up-down direction by a mechanism other than ball-screw portion 331.

Grounding detection device 6 may detect grounding based on, for example, a leaked amount of fluid (gas (air, nitrogen), liquid (oil), or the like). Specifically, the gas passage is positioned so that the amount of air leakage increases when suction nozzle 37 rises relative to cladding portion 360. Further, in the ungrounded state shown in step S1 of FIG. 6, a predetermined amount of air is already leaked and the leaked amount is set to reference level a1. Further, threshold a2 is set to 110% with reference level a1 at 100%. In this way, when electronic component P is switched from the ungrounded state to the grounded state and the leaked amount reaches threshold a2 or more, control device 7 can determine the grounding state. Thus, grounding detection device 6 may be made to detect the grounding based on a signal relating to a detected value (flow rate, mass, distance, current, voltage, etc.) that changes continuously from the ungrounded state to the grounded state.

REFERENCE SIGNS LIST

1: Electronic component mounter, 2: Base, 3: Module, 4: Tape feeder, 5: Device pallet, 6: Grounding detection device, 7: Control device (Grounding discrimination section), 30: Board conveyance device, 31: XY robot, 32: Mounting head, 33: Lifting and lowering portion, 34: Revolution portion, 35: Rotation portion, 36: Holder, 37: Suction nozzle, 60: Photoelectric sensor, 70: Input/output interface, 71: Calculation section, 72: Storage section, 310: Y-axis slider, 311: Y-axis motor, 312: X-axis slider, 313: X-axis motor, 314: Y-axis guide rail, 315: X-axis guide rail, 320: Cover, 330: Z-axis motor, 331: Ball-screw portion, 331a: Shaft, 331b: Nut, 332: Recessed portion, 340: Q-axis motor, 341: Revolution first gear, 342: Second rotation gear, 343: Revolution shaft, 344: Rotation plate, 345: Collar, 350: R-axis motor, 351: First rotation gear, 352: Second rotation gear, 353: Third rotation gear, 360: Cladding portion, 360a: Outer cylindrical member, 360b: Stepped surface, 360c: Protruding portion, 360d: Holder gear, 360e: Pin, 361: Core portion, 361a: Detection target portion, 361b: First shaft member, 361c: Second shaft member, 361d: Enlarged diameter portion, 361e: First inner cylindrical member, 361f: Reduced diameter portion, 361g: Second inner cylindrical member, 361h: Elongated hole, 370: Elongated hole, 371: Pickup portion, 380: First spring, 381: Second spring, 382: Third spring, 390: Board lifting and lowering device, 391: Housing, A: Detection region, B: Board, D: Time lag, F: Dead region, P: Electronic component, Q: Revolution axis, R: Rotation axis, S: Pushing stroke, a1: Reference level, a2: Threshold

The invention claimed is:

1. An electronic component mounter, comprising:
a mounting head configured to mount an electronic component to a board, the mounting head including:
a suction nozzle including a pickup portion configured to hold the electronic component;
a nozzle holder configured to hold the suction nozzle, the nozzle holder including a core portion and a cladding portion that move relative to each other, an upper end of the core portion including a detection target portion, the upper end being an axial end of the core portion distal from the pickup portion;
a lifting and lowering portion configured to lift and lower the nozzle holder via the cladding portion; and
a photoelectric sensor on the lifting and lowering portion and configured to emit light to a detection region in which the detection target portion of the core portion moves relative to the cladding portion, and to receive the light from the detection region; and
processing circuitry configured to detect the detection target portion based on a signal from the photoelectric sensor.

2. The electronic component mounter of claim 1, wherein the processing circuitry discriminates between a presence or absence of grounding of the electronic component based on a change in a received light level of the photoelectric sensor in an ungrounded state with respect to a reference level.

3. The electronic component mounter of claim 2, wherein the processing circuitry updates the reference level at a predetermined timing.

4. The electronic component mounter of claim 3, wherein the predetermined timing is a timing of the grounding.

5. The electronic component mounter of claim 1, wherein the detection target portion is associated with a movement of the suction nozzle.

6. The electronic component mounter of claim 1, wherein when the nozzle holder is lowered and the electronic component is grounded to the board, the suction nozzle and the core portion stop descending and the cladding portion rises relative to the core portion to move the detection target portion into the detection region, and
the processing circuitry determines a presence of a grounding state when the photoelectric sensor receives a predetermined amount of light from the detection target portion in the detection region.

* * * * *